United States Patent
Lagally et al.

(10) Patent No.: US 10,176,991 B1
(45) Date of Patent: Jan. 8, 2019

(54) HIGH-QUALITY, SINGLE-CRYSTALLINE SILICON-GERMANIUM FILMS

(71) Applicant: Wisconsin Alumni Research Foundation, Madison, WI (US)

(72) Inventors: Max G. Lagally, Madison, WI (US); Thomas Francis Kuech, Madison, WI (US); Yingxin Guan, Madison, WI (US); Shelley A. Scott, Madison, WI (US); Abhishek Bhat, Madison, WI (US); Xiaorui Cui, Middleton, WI (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 0 days.

(21) Appl. No.: 15/643,111

(22) Filed: Jul. 6, 2017

(51) Int. Cl.
| | |
|---|---|
| *H01L 29/78* | (2006.01) |
| *H01L 21/02* | (2006.01) |
| *H01L 21/78* | (2006.01) |
| *C30B 29/52* | (2006.01) |
| *C30B 25/02* | (2006.01) |
| *C30B 29/08* | (2006.01) |
| *C30B 29/68* | (2006.01) |
| *H01L 31/0352* | (2006.01) |
| *H01L 31/109* | (2006.01) |

(Continued)

(52) U.S. Cl.
CPC ........ *H01L 21/02694* (2013.01); *C30B 25/02* (2013.01); *C30B 29/08* (2013.01); *C30B 29/52* (2013.01); *C30B 29/68* (2013.01); *H01L 21/0262* (2013.01); *H01L 21/02395* (2013.01); *H01L 21/02461* (2013.01); *H01L 21/02463* (2013.01); *H01L 21/02532* (2013.01); *H01L 21/7813* (2013.01); *H01L 29/165* (2013.01); *H01L 29/7378* (2013.01); *H01L 29/7786* (2013.01); *H01L 29/78* (2013.01); *H01L 31/035254* (2013.01); *H01L 31/109* (2013.01); *H01L 31/1812* (2013.01); *H01L 31/1892* (2013.01)

(58) Field of Classification Search
CPC .................................................. H01L 21/02694
See application file for complete search history.

(56) References Cited

U.S. PATENT DOCUMENTS 5,580,381 A * 12/1996 Yamagata ............... C30B 25/18
                                                         117/101
6,573,126 B2    6/2003 Cheng et al.
(Continued)

OTHER PUBLICATIONS

Bai et al., Ge/III-V Heterostructures and Their Applications in Fabricating Engineered Substrates, ECS Transactions, 33 (6), 2010, pp. 927-932.

(Continued)

*Primary Examiner* — Eugene Lee
(74) *Attorney, Agent, or Firm* — Bell & Manning, LLC

(57) ABSTRACT

High-quality, single-crystalline silicon-germanium ($Si_{(1-x)}Ge_x$) having a high germanium content is provided. Layers of the high-quality, single-crystalline silicon-germanium can be grown to high sub-critical thicknesses and then released from their growth substrates to provide $Si_{(1-x)}Ge_x$ films without lattice mismatch-induced misfit dislocations or a mosaic distribution of crystallographic orientations.

24 Claims, 9 Drawing Sheets

(51) Int. Cl.
  *H01L 31/18* (2006.01)
  *H01L 29/165* (2006.01)
  *H01L 29/737* (2006.01)
  *H01L 29/778* (2006.01)

(56) References Cited

U.S. PATENT DOCUMENTS

| | | | |
|---|---|---|---|
| 7,008,857 B2 | 3/2006 | Ghyselen et al. | |
| 7,229,901 B2* | 6/2007 | Savage | H01L 21/6835 257/E21.093 |
| 7,973,336 B2 | 7/2011 | Savage et al. | |
| 8,821,635 B2* | 9/2014 | Kouvetakis | B32B 15/02 117/101 |
| 8,895,406 B2 | 11/2014 | Rogers et al. | |
| 8,932,403 B1 | 1/2015 | Li et al. | |
| 9,349,900 B2 | 5/2016 | Rogers et al. | |
| 2003/0094673 A1* | 5/2003 | Dunn | H01L 21/8249 257/566 |
| 2004/0137735 A1* | 7/2004 | Sakai | H01L 21/02381 438/689 |
| 2006/0011916 A1* | 1/2006 | Sakai | H01L 21/02381 257/65 |
| 2007/0287269 A1 | 12/2007 | Yokokawa et al. | |
| 2008/0138959 A1 | 6/2008 | Yokokawa et al. | |
| 2012/0217618 A1* | 8/2012 | Kouvetakis | C01B 6/06 257/616 |
| 2014/0217468 A1* | 8/2014 | Cheng | H01L 29/267 257/192 |

OTHER PUBLICATIONS

Ma et al., Multilayered paper-like electrodes composed of alternating stacked mesoporous Mo2N nanobelts and reduced graphene oxide for flexible all-solid-state supercapacitors, J. Mater. Chem. A, 3, Jun. 1, 2015, pp. 14617-14624.
Littlejohns et al., Next Generation Device Grade Silicon-Germanium on Insulator, Scientific Reports 5:8288, Feb. 6, 2015, pp. 1-6.
Paskiewicz et al., Nanomembrane-based materials for Group IV semiconductor quantum electronics, Scientific Reports 4:4218, Feb. 27, 2015, pp. 1-7.
Rogers et al., Synthesis, assembly and applications of semiconductor nanomembranes, Nature, vol. 477, Sep. 1, 2011, pp. 45-53.
Zheng et al., Strained state of the layer system depending on the SiGe layer thickness by micro-Raman mapping, Journal of Crystal Growth 264, 2004, pp. 104-109.
Orlowski et al., Si, SiGe, Ge, and III-V Semiconductor Nanomembranes and Nanowires Enabled by SiGe Epitaxy, ECS Transactions, 33 (6), 2010, pp. 777-789.
Fukuda et al., Critical Thickness for the Si1—xGex/Si Heterostructure, Japanese Journal of Applied Physics, vol. 29, No. 1, Jan. 1990, pp. L 20-L 22.
Garone et al., Mobility Enhancement and Quantum Mechanical Modeling in GexSi1-x Channel MOSFETs From 90 to 300 K, International Electron Devices Meeting, 1991.
Durmaz et al., SiGe Nanomembrane Quantum-Well Infrared Photodetectors, ACS Photonics, 3, Sep. 26, 2016, pp. 1978-1985.
King et al., Bandgap and Transport Properties of Si1—xGex by Analysis of Nearly Ideal Si/Si1—Gex/Si Heterojunction Bipolar Transistors, IEEE Transactions on Electron Devices. vol. 36, No. 10, Oct. 1989, pp. 2093-2104.
Murakami et al., Fabrication of a Strain-Controlled SiGe/Ge MODFET With Ultrahigh Hole Mobility, IEEE Transactions on Electron Devices, vol. 41, No. 5, May 1994, pp. 857-861.
Paul et al., Electroluminescence from Si/SiGe quantum cascade emitters, Physica E 16, 2003, pp. 309-314.
B. Williams, Terahertz quantum-cascade lasers, Nature Photonics, vol. 1, Sep. 2007, pp. 517-525.
Lee et al., Searching for a Solid-State Terahertz Technology, Science, vol. 316, Apr. 6, 2007, pp. 64-65.
Cheng et al., Epitaxial lift-off process for gallium arsenide substrate reuse and flexible electronics, Nature Communications| 4:1577, Mar. 12, 2013.
Shah et al., Reverse graded relaxed buffers for high Ge content SiGe virtual substrates, Appl. Phys. Lett., vol. 93, 192103, Nov. 10, 2008.
Driscoll et al., Design of n-type silicon-based quantum cascade lasers for terahertz light emission, Journal of Applied Physics 102, 093103, Nov. 6, 2007.
Ferguson et al., Materials for terahertz science and technology, Nature Materials, vol. 1, Sep. 2002, pp. 26-33.

* cited by examiner

HIGH-QUALITY, SINGLE-CRYSTALLINE SILICON-GERMANIUM FILMS

REFERENCE TO GOVERNMENT RIGHTS

This invention was made with government support under DE-FG02-03ER46028 awarded by the US Department of Energy and under DMR1121288 awarded by the National Science Foundation. The government has certain rights in the invention.

BACKGROUND $Si_{(1-x)}Ge_x$ single-crystal thin films have been grown epitaxially on silicon. However, the thickness of these films is limited because, beyond a certain thickness (referred to as the critical thickness), the strain induced in the $Si_{(1-x)}Ge_x$ by the lattice mismatch between the growth substrate and the $Si_{(1-x)}Ge_x$ begins to plastically relax, which results in the formation of lattice mismatch-induced misfit dislocations in the $Si_{(1-x)}Ge_x$. Moreover, as the Ge content of the $Si_{(1-x)}Ge_x$ increases, the critical thickness of the film decreases. As a result, high-quality, single-crystalline films of $Si_{(1-x)}Ge_x$ with a high Ge content cannot be grown on silicon to adequate thicknesses for many practical processing techniques and device applications. High-Ge-content $Si_{(1-x)}Ge_x$ single-crystal thin films can be grown epitaxially on germanium. However, the critical thickness of these films decreases with increasing silicon content and, therefore, high-quality $Si_{(1-x)}Ge_x$ films with thicknesses useful for many device applications can only be achieved for $Si_{(1-x)}Ge_x$ films with a very high Ge content when germanium is used as the growth substrate.

High Ge content $Si_{(1-x)}Ge_x$ has been grown epitaxially over compositionally graded, plastically relaxed growth substrates. Unfortunately, the plastically relaxed growth substrates are characterized by lattice mismatch-induced misfit dislocations and their associated threading dislocations, and these propagate through the $Si_{(1-x)}Ge_x$. Moreover, the resulting $Si_{(1-x)}Ge_x$ films are characterized by a non-uniform strain distribution and small-angle tilt boundaries, which degrade the crystal quality and, therefore, the performance of devices incorporating the $Si_{(1-x)}Ge_x$.

SUMMARY

High-quality, single-crystalline silicon-germanium ($Si_{(1-x)}Ge_x$) and electronic devices incorporating the films as active layers are provided.

One embodiment of a high-quality single-crystalline $Si_{(1-x)}Ge_x$ material is a layer of single-crystalline $Si_{(1-x)}Ge_x$, where $0.4 \leq x < 1$, having a thickness of at least 40 nm, wherein the single-crystalline $Si_{(1-x)}Ge_x$ does not comprise a mosaic distribution of crystallographic orientations.

One embodiment of an electronic device that incorporates high-quality, single-crystalline $Si_{(1-x)}Ge_x$ includes: a first electrode; a second electrode; and a layer of single-crystalline $Si_{(1-x)}Ge_x$, where $0.4 \leq x < 1$, in electrical communication with the first electrode and the second electrode, the layer of single-crystalline $Si_{(1-x)}Ge_x$ having a thickness of at least 40 nm, wherein the single-crystalline $Si_{(1-x)}Ge_x$ does not comprise a mosaic distribution of crystallographic orientations. The first and second electrodes can be in electrical communication with the single-crystalline $Si_{(1-x)}Ge_x$ via direct physical contact with the single-crystalline $Si_{(1-x)}Ge_x$ or through an intervening material that separates the electrodes from the single-crystalline $Si_{(1-x)}Ge_x$.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
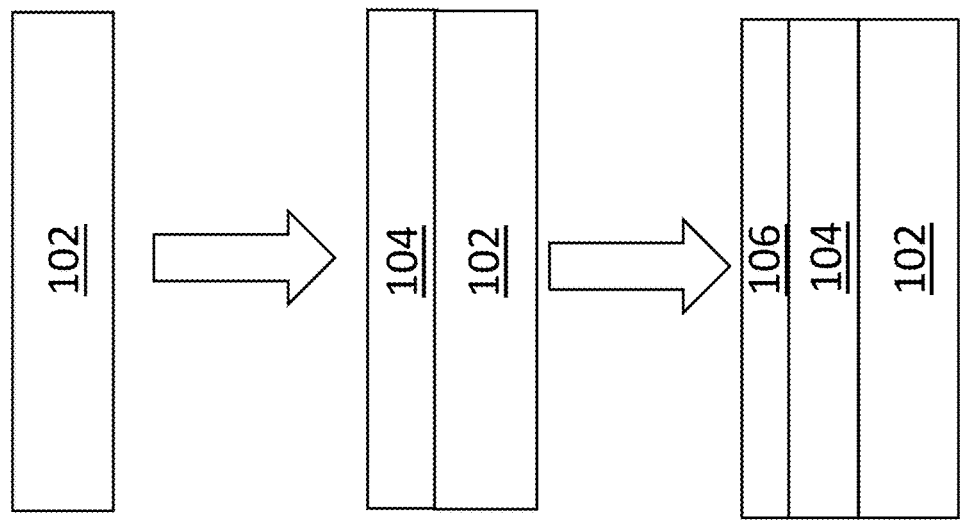
FIG. 1 is a schematic diagram of a method for growing high-quality, single-crystalline silicon-germanium on a sacrificial growth layer.

High-quality, single-crystalline silicon-germanium ($Si_{(1-x)}Ge_x$) films, including films having commercially practical thicknesses and high germanium contents, are provided. Also provided are methods of forming films of the high-quality, single-crystalline silicon-germanium.

The high-quality, single-crystalline silicon-germanium films are free of the lattice mismatch-induced misfit dislocations and their associated threading dislocations that would result from the epitaxial growth of the films above their critical thicknesses or from the epitaxial growth of the films on plastically relaxed, compositionally graded growth substrates. The silicon-germanium films also lack the strain variations and small-angle tilt boundaries that characterize films grown on plastically relaxed, compositionally graded growth substrates. The formation of these strain variations in materials grown epitaxially on a plastically relaxed, compositionally graded growth substrate can be explained as follows: when the compositionally graded substrate is plastically relaxed, a non-uniform distribution of misfit dislocations is formed in the growth substrate, which results in a non-uniform strain distribution in the epitaxial layer grown on top. This strain variation can be detected using micro-Raman spectroscopy, as illustrated in Paskiewicz, D. M., et a. "Nanomembrane-based materials for Group IV semiconductor quantum electronics." *Scientific Reports* 4 (2014).

In addition, the plastic relaxation of the graded growth substrate results in the formation of crystallites having small misorientations with respect to each other, which are observed as small-angle tilt boundaries. These small-angle tilt boundaries are transferred to the epitaxial layer grown on the plastically relaxed substrate. As a result, the epitaxial layer grown on the plastically relaxed substrate is characterized by a mosaic distribution of crystallographic orientations, which can be observed as a crosshatch pattern in a micro-Raman map of the crystalline structure, as described in Paskiewicz, et al. These misfit dislocation-induced, small-angle tilt boundaries that can be detected as a crosshatch pattern in a micro-Raman map of the crystalline structure (referred to herein as small-angle tilt boundaries) are not present in the high-quality, single-crystalline silicon-germanium made by the methods described herein.

The high-quality, single-crystalline silicon-germanium, which has a (001) orientation, can be grown epitaxially on a sacrificial growth layer having a low lattice mismatch with the $Si_{(1-x)}Ge_x$. Using sacrificial growth layers having low lattice mismatches with the silicon-germanium allows for the growth of high-germanium-content, single-crystalline silicon-germanium layers with high critical thicknesses. The sacrificial growth layer may be grown on an underlying support substrate with which it has a low lattice mismatch. After the growth of the $Si_{(1-x)}Ge_x$ layer is completed, it can be released as an unstrained $Si_{(1-x)}Ge_x$ film from the sacrificial growth layer and any underlying support substrate by selectively removing the sacrificial growth layer. Alternatively, the $Si_{(1-x)}Ge_x$ layer can be bonded to a host substrate before being released from its sacrificial growth substrate, whereby the host substrate prevents the elastic relaxation of the strain in the $Si_{(1-x)}Ge_x$. As a result, the bonded and transferred $Si_{(1-x)}Ge_x$ at least partially retains the strain imparted to it by the sacrificial growth substrate.

In other embodiments, the $Si_{(1-x)}Ge_x$ film is one layer of a multilayered heterostructure that is grown epitaxially on a sacrificial growth layer. After the growth of the epitaxial heterostruture is completed, it can be released from the sacrificial growth layer, whereby elastically strained layers in the heterostucture partially elastically relax via elastic strain sharing with the other layers in the heterostructure. During elastic stain sharing between the layers, layers that are under a compressive strain become partially relaxed through the introduction of a tensile strain in their adjacent layers, such that the global average strain in the heterostructure is zero.

Some embodiments of the growth methods use a GaAs support substrate with an overlying $Ga_yAl_{1-y}As$ sacrificial growth layer, where $0 \leq y < 1$. The low lattice mismatch between the GaAs, the GaAlAs, and the SiGe allows for the epitaxial growth of high-quality, single-crystalline $Si_{(1-x)}Ge_x$ on the $Ga_yAl_{(1-y)}As$, where $0.8 \leq x < 1$, with critical thicknesses of up to about 230 nm, or greater. Alternatively, a layer of GaAs can be grown epitaxially over the $Ga_yAl_{(1-y)}As$ sacrificial layer and the $Si_{(1-x)}Ge_x$ can be grown directly on that layer of GaAs. The $Si_{(1-x)}Ge_x$/GaAs bilayer can then be released by the selective removal of the $Ga_yAl_{(1-y)}As$ sacrificial layer.

In another embodiment, a sacrificial layer of $Ga_zIn_{(1-z)}P$, where $0.75 \leq z < 0.98$ is used as a growth layer for the $Si_{(1-x)}Ge_x$. The $Ga_zIn_{(1-z)}P$ sacrificial layer can be prepared by growing the $Ga_zIn_{(1-z)}P$ on GaP to a thickness below its critical thickness, etching away the GaP to release the strain in the $Ga_zIn_{(1-z)}P$, and then transferring and bonding the $Ga_zIn_{(1-z)}P$ to a host substrate to provide a growth layer for the $Si_{(1-x)}Ge_x$ that has an appropriate lattice constant. Over the released, transfer-bonded $Ga_zIn_{(1-z)}P$, a layer of $Si_{(1-x)}Ge_x$, where $0.2 \leq x \leq 0.5$, can be grown epitaxially to a critical thickness of up to 1 μm, or greater. $Si_{(1-x)}Ge_x$ having a lower critical thickness can be grown for $Si_{(1-x)}Ge_x$ alloys having germanium contents outside that range.

Alternatively, a sacrificial layer of $Ga_zIn_{(1-z)}P$, where $0.5 < z < 0.75$, can be prepared by growing the $Ga_zIn_{(1-z)}P$ on GaAs to a thickness below its critical thickness and then etching away the GaAs to release the strain in the $Ga_zIn_{(1-z)}P$ to provide a growth layer for the $Si_{(1-x)}Ge_x$ that has an appropriate lattice constant. Over the released $Ga_zIn_{(1-z)}P$, a layer of $Si_{(1-x)}Ge_x$, where $0.5 \leq x \leq 0.8$, can be grown epitaxially to a critical thickness of up to 1 μm, or greater. $Si_{(1-x)}Ge_x$ having a lower critical thickness can be grown for $Si_{(1-x)}Ge_x$ alloys having germanium contents outside that range.

Figure 4:
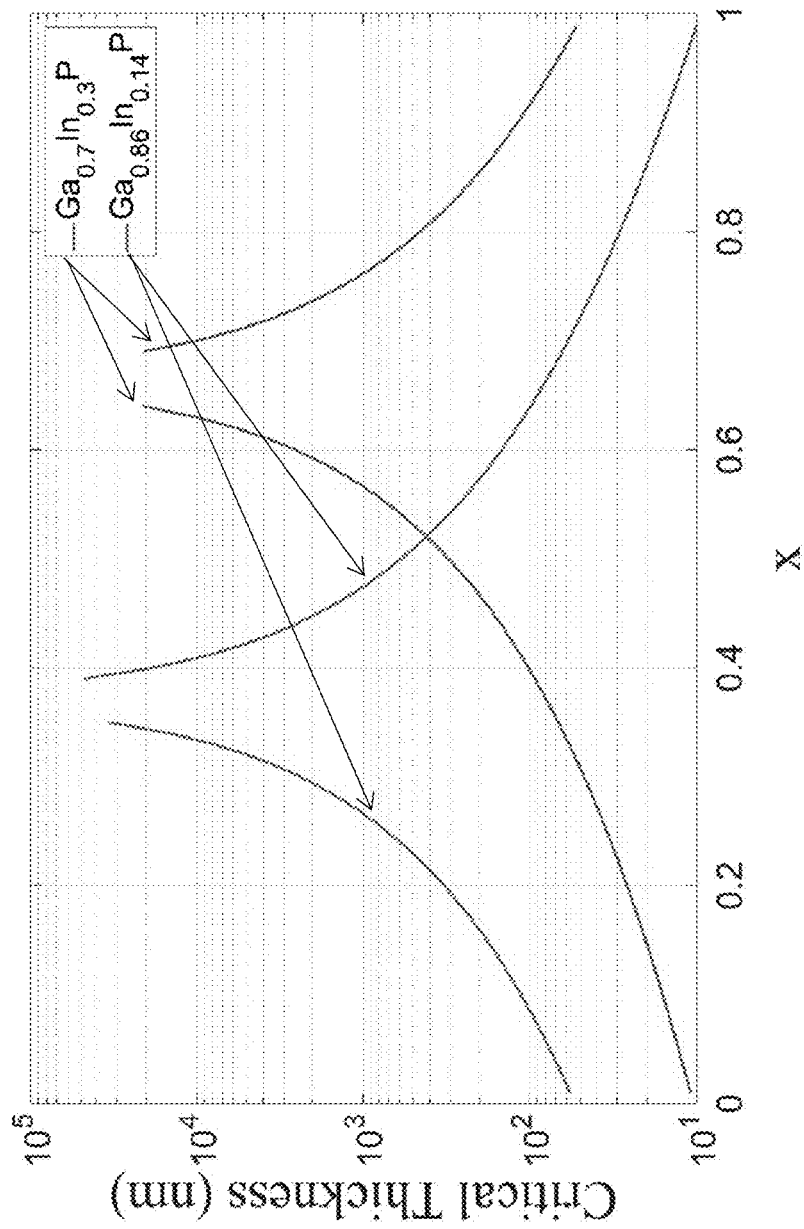
FIG. 4 is a graph showing the relationship between the critical thickness and the germanium content for $Si_{(1-x)}Ge_x$ grown on two GaInP alloys.

The critical thickness of the $Si_{(1-x)}Ge_x$ will depend on the germanium content of the silicon-germanium and on the composition of the substrate upon which it is grown. This is illustrated in the graph of FIG. 4, which shows the relationship between the germanium content, x, and the critical thickness for $Si_{(1-x)}Ge_x$ grown on $Ga_{0.7}In_{0.3}P$ and $Ga_{0.86}In_{0.14}P$. As shown in the graph, using the present methods, $Si_{(1-x)}Ge_x$ films with critical thicknesses in the range from 10 nm (or lower) to 10 μm can be grown with germanium contents in the range of $0.2 \leq x < 1$. Therefore, by using the appropriate growth substrate, $Si_{(1-x)}Ge_x$ layers having a wide range of germanium contents and sub-critical thicknesses can be grown. The grown layers can then be released from their sacrificial growth substrates to provide free-standing films that are free of lattice-mismatch-induced threading dislocations. By way of illustration only, high-quality, single-crystalline $Si_{(1-x)}Ge_x$ films with $x \geq 0.2$ can be grown to a thickness of at least 30 nm. This includes films of $Si_{(1-x)}Ge_x$ with: $x \geq 0.3$; $x \geq 0.35$; $x \geq 0.4$; $x \geq 0.45$; $x \geq 0.5$; $x \geq 0.55$; $x \geq 0.6$; $x \geq 0.65$; $x \geq 0.7$; $x \geq 0.75$; $x \geq 0.8$; $x \geq 0.85$; $x \geq 0.9$; and $x \geq 0.95$. Illustrative ranges for the Ge content of the $Si_{(1-x)}Ge_x$ include: $0.2 \leq x \leq 0.99$; $0.2 \leq x \leq 0.90$; $0.2 \leq x \leq 0.80$; $0.3 \leq x \leq 0.99$; $0.4 \leq x \leq 0.99$; $0.5 \leq x \leq 0.99$; $0.55 \leq x \leq 0.95$; $0.6 \leq x \leq 0.95$; $0.7 \leq x \leq 0.95$; $0.6 \leq x \leq 0.85$; $0.7 \leq x \leq 0.85$; and $0.7 \leq x \leq 0.8$. High-quality, single-crystalline germanium layers (i.e., $x=1$) can also be grown with the methods described herein. Various embodiments of these layers can be grown to sub-critical thickness of: at least 40 nm; at least 50 nm; at least 60 nm; at least 70 nm; at least 80 nm; at least 90 nm; at least 100 nm; at least 200 nm; at least 300 nm; at least 500 nm; at least 1 μm; and at least 5 μm. Illustrative ranges for the layer thicknesses include 30 nm to 5 μm, 50 nm to 250 nm, and 100 nm to 230 nm.

If the $Si_{(1-x)}Ge_x$ films are grown on imperfect growth layers that contain misfit dislocations and threading dislocations, those defects may propagate into the growing $Si_{(1-x)}Ge_x$ layer. Therefore, some embodiments of the $Si_{(1-x)}Ge_x$ films may contain misfit dislocations and associated threading dislocations, although such dislocations are not induced by the plastic relaxation of strain caused by the lattice mismatch between the growth substrate and the $Si_{(1-x)}Ge_x$ films during film growth. These dislocation defects, when present, are present at low densities. For example, some embodiments of the $Si_{(1-x)}Ge_x$ films have misfit dislocation densities and threading dislocation densities of less than $1 \times 10^5$ cm$^{-2}$. This includes embodiments of the $Si_{(1-x)}Ge_x$ films having misfit dislocation densities and threading dislocation densities of less than $1 \times 10^4$ cm$^{-2}$ and further includes embodiments of the $Si_{(1-x)}Ge_x$ films having misfit dislocation densities and threading dislocation densities of less than $1 \times 10^3$ cm$^{-2}$.

The high-quality, single-crystalline silicon-germanium can be formed as large-area, free-standing films with low surface roughnesses. For example, films of the high-quality, single-crystalline silicon-germanium can have a wafer-scale, or larger, area, as measured by the area of the upper surface of the film. This includes films of the high-quality, single-crystalline silicon-germanium that have areas of at least 1 mm$^2$, at least 10 mm$^2$, at least 5 cm$^2$, at least 10 cm$^2$, at least 50 cm$^2$, and at least 100 cm$^2$. The films can be formed as regular geometric shapes (e.g., squares, rectangles, circles, etc.) or irregular shapes. Embodiments of the films of high-quality, single-crystalline silicon-germanium may have a root mean square (rms) roughness of 2.5 nm or lower, 2 nm or lower, 1 nm or lower, 0.6 nm or lower, 0.5 nm or lower, and 0.4 nm or lower, where the rms roughness of the films can be determined based on Atomic Force Microscopy (AFM).

Figure 2:
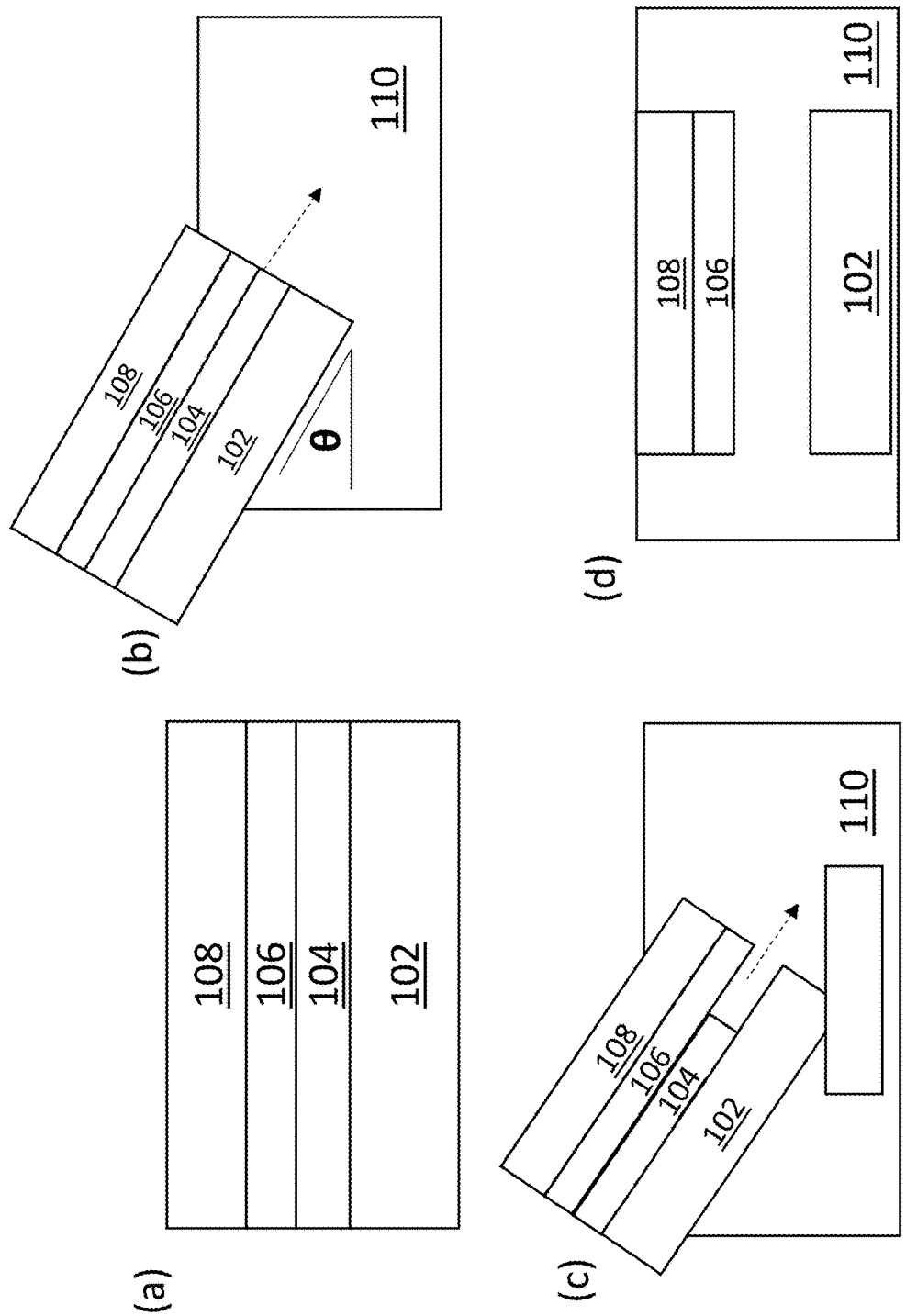
FIG. 2 is a schematic diagram of a method for releasing the high-quality, single-crystalline silicon-germanium from the underlying heterostructure.

One embodiment of a method for making the high-quality, single-crystalline silicon-germanium is shown in FIG. 1 and FIG. 2. The method starts with a gallium arsenide (GaAs) support substrate 102 (FIG. 1, top panel), such as a GaAs wafer, upon which a thin layer of $Ga_yAl_{(1-y)}As$ 104, where $0 \leq y < 1$, is grown (FIG. 1, middle panel) to a sub-critical thickness. The $Ga_yAl_{(1-y)}As$ may have a gallium content in the range of, for example, $0 \leq y < 0.5$, including $0 \leq y < 0.2$. A layer of high-Ge-content, single-crystalline $Si_{(1-x)}Ge_x$ (or pure germanium) 106 is then grown to the desired, sub-critical thickness on the $Ga_yAl_{(1-y)}As$ layer (FIG. 1, bottom panel). The $Ga_yAl_{(1-y)}As$ and the $Si_{(1-x)}Ge_x$ can be grown using epitaxial growth processes, such as metal organic chemical vapor deposition (MOCVD), as illustrated in the Example.

As shown in FIG. 2, a layer of photoresist 108 is then applied to the upper surface of $Si_{(1-x)}Ge_x$ 106 in the GaAs/GaAlAs/SiGe (or GaAs/GaAlAs/Ge) heterostructure (panel (a)) by, for example, spin-coating. The front edge of the heterostructure is then inserted into an etchant solution 110 that selectively etches $Ga_yAl_{(1-y)}As$ 104, relative to $Si_{(1-x)}Ge_x$ 106 and photoresist 108 (panel (b)). As a result, $Ga_yAl_{(1-y)}As$ 104 dissolves, beginning at its front edge, releasing $Si_{(1-x)}Ge_x$ 106 and photoresist 108 (panel (c)). As the heterostructure continues to be fed into etchant solution 110 (panel (c)), $Ga_yAl_{(1-y)}As$ 104 is progressively etched away and $Si_{(1-x)}Ge_x$ 106 and photoresist 108 are progressively released, until the complete release of the $Si_{(1-x)}Ge_x$ and the photoresist layers has occurred (panel (d)). GaAs substrate 102 then sinks, while $Si_{(1-x)}Ge_x$ 106 and photoresist 108 remain at the surface of etchant solution 110. The etchant solution may comprise a dilute solution of hydrochloric acid (HCl) and/or hydrofluoric acid (HF). For example, a dilution of 1:100 49% HF:H$_2$O or a dilution of 1:12 (including 1:6 to 1:8) 37% HCl:H$_2$O could be used.

The photoresist is desirably selected such that it renders the released SiGe/photoresist bilayer buoyant in the etchant solution and also induces a tensile strain on the $Si_{(1-x)}Ge_x$ layer. This has the advantage of flexing the $Si_{(1-x)}Ge_x$ layer upward toward the surface and away from the bulk of the etchant solution as it is released, so that the exposure of the $Si_{(1-x)}Ge_x$ to any harmful etching reaction products can be reduced. In addition, by flexing the released portion of the SiGe/photoresist bilayer away from the rest of the heterostructure, the photoresist can help gaseous etching reaction products to escape more easily. Suitable photoresists include electron-beam (E-beam) photoresists, such as novolak-based photoresists, including S1813 available from Dow (Shipley), and acrylate-styrene co-polymer resists, such as ZEP520, a copolymer of α-chloromethacrylate and α-methylstyrene, available from Zeon Chemicals. Other polymers that render the released SiGe/photoresist bilayer buoyant in the etchant solution and induce a tensile strain on the $Si_{(1-x)}Ge_x$ layer could also be used.

The angle and rate at which the heterostructure is introduced and fed into the etchant solution should be designed to allow for the escape of gaseous etchant reaction products from the etch front. This is important because gas bubbles that are trapped between the $Si_{(1-x)}Ge_x$ and the release layer during the etching process can rupture and create holes in, or otherwise damage, the $Si_{(1-x)}Ge_x$. Suitable feed angles include those in the range from 10° to 60°, including 15° to 30°, wherein the feed angle, θ, is the angle formed between the surface of the etchant solution and the surface of the heterostructure, as shown in FIG. 2. Suitable feed rates include those in the range from 0.1 mm/h to 2.2 mm/h, including those in the range from 0.4 mm/hr to 1.2 mm/h.

Figure 3:
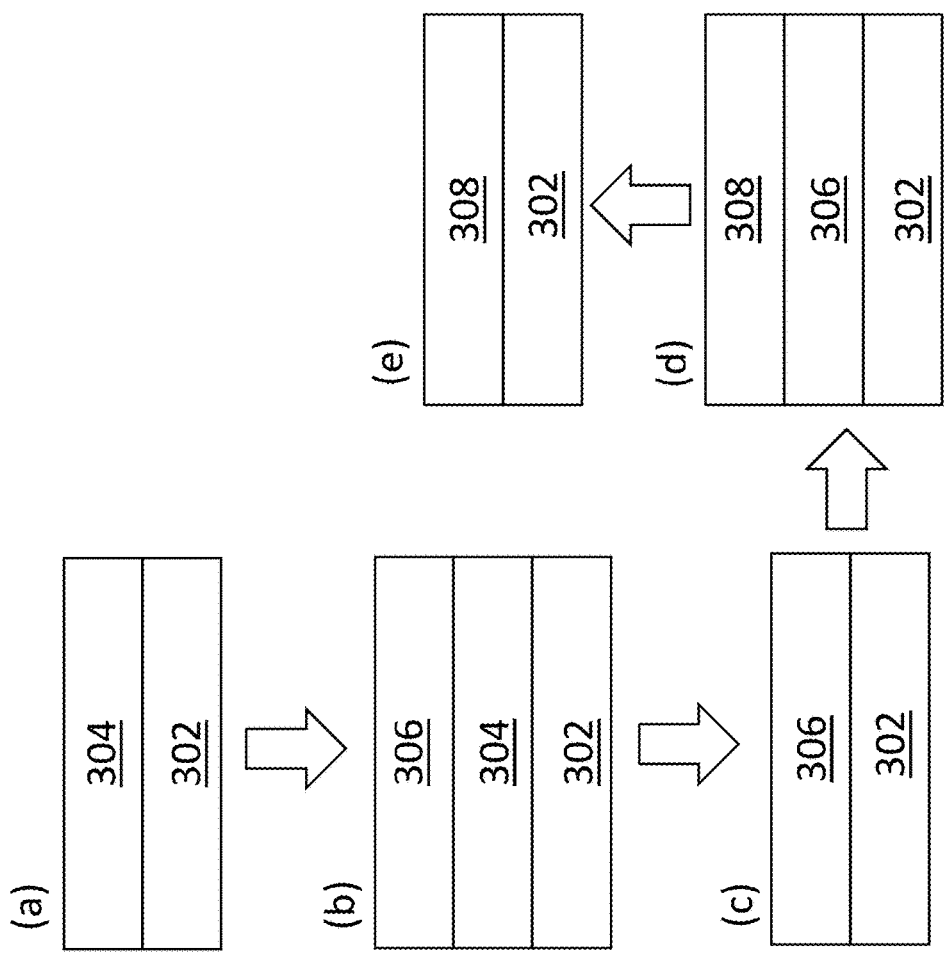
FIG. 3 is a schematic diagram of another method for growing high-quality, single-crystalline silicon-germanium on a sacrificial growth layer.

An alternative embodiment of a method for making the high-quality, single-crystalline silicon-germanium is shown in FIG. 3. The method starts with an unstrained layer of GaAs 304 on a host substrate 302 (panel (a)). For example, the unstrained GaAs layer can be obtained by a release and transfer method in which a layer of crystalline GaAs is grown epitaxially on a substrate. That substrate is then selectively etched away, releasing the GaAs layer in an unstrained state. The released, unstrained layer can then be transferred to a host substrate 302. Methods for the release and transfer of thin crystalline GaAs layers (also referred to a nanomembranes or "NMs") can be found in J. A. Rogers, M. G. Lagally, and R. G. Nuzzo. "Synthesis, assembly and applications of semiconductor nanomembranes." *Nature* 477.7362 (2011): 45-53. (Alternatively, the crystalline device layer of a semiconductor-on-insulator (e.g., silicon-on-insulator; SOI) can be used as the growth substrate.) A thin layer of $Ga_zIn_{(1-z)}P$, where $0 \leq z < 1$, 306 is then epitaxially grown to a sub-critical thickness on GaAs layer 304 (panel (b)). GaAs layer 304 is then selectively etched away, which releases the layer of $Ga_zIn_{(1-z)}P$ 306 and elastically relaxes any lattice mismatch-induced strain in the $Ga_zIn_{(1-z)}P$ (panel (c)). The elastically relaxed $Ga_zIn_{(1-z)}P$ 306 can have a lattice that is closely matched to the $Si_{(1-x)}Ge_x$ and can serve as a new sacrificial growth layer for the epitaxial growth of a $Si_{(1-x)}Ge_x$ layer 308 (panel (d)). If desired, the thickness of the released, relaxed $Ga_zIn_{(1-z)}P$ layer 306 can be increased by further epitaxial growth prior to proceeding with the growth of the $Si_{(1-x)}Ge_x$. The $Ga_zIn_{(1-z)}P$ and the $Si_{(1-x)}Ge_x$ can be grown using epitaxial growth processes, such as MOCVD. Finally, the layer of $Ga_zIn_{(1-z)}P$ 306 can be selectively etched away to release $Si_{(1-x)}Ge_x$ layer 308 (panel (e)), using, for example, HCl as an etchant. Although not shown in FIG. 3, a layer of photoresist could be deposited on the $Si_{(1-x)}Ge_x$ layer 308 prior to its release, and the release of $Si_{(1-x)}Ge_x$ layer 308 could be carried out using the process shown in FIG. 2.

Although the methods of FIGS. 1-3 are illustrated and described in terms of forming high-quality, single-crystalline silicon-germanium layers, these methods can also be used for the epitaxial growth and release of high-quality, single-crystalline germanium layers.

The released $Si_{(1-x)}Ge_x$ layer (or Ge layer) is a free-standing film (or "nanomembrane") in that it does not require a support substrate to provide it with structural integrity and is not fixed to a substrate at an epitaxial interface. As used herein the term "epitaxial interface" refers to an interface in which the crystallographic orientation of an overlying layer is controlled by that of its underlying layer, such that the two layers have the same lattice constant (i.e., crystalline arrangement), at least in the area of the interface. An epitaxial interface may include strains and stresses at the interface, induced by a lattice mismatch between the two materials. In contrast to such epitaxial interfaces, non-epitaxial interfaces have crystallographic orientations that are independent from (e.g., different from) those of their neighboring layers and are free from lattice mismatch-induced strains and stresses.

Before or after the $Si_{(1-x)}Ge_x$ layer (or the Ge layer) has been released from its growth substrate, it can be bonded to a variety of host substrates, including host substrates upon which the $Si_{(1-x)}Ge_x$ (or Ge) could not be grown epitaxially and/or flexible substrates, such as polymeric substrates. If the released $Si_{(1-x)}Ge_x$ film or the Ge film is bonded to a flexible host substrate, it can be mechanically stretched and/or compressed after transfer. This is advantageous because it makes it possible to introduce a tensile or compressive uniaxial, biaxial, or shear stain in the material. The host substrate can also be a semiconductor substrate composed of, for example, a Group III-V semiconductor, a Group II-VI semiconductor, or a Group IV semiconductor, such as silicon, germanium, or another $Si_{(1-x)}Ge_x$ alloy having a different germanium content (i.e., a different x value).

After a layer of $Si_{(1-x)}Ge_x$ is released from its sacrificial growth layer—either as a single-layer or as part of a multilayered heterostructure—one or more additional semiconductor layers can be grown epitaxially on the $Si_{(1-x)}Ge_x$. These additional layers may be strained or unstrained, depending upon their lattice mismatch with the $Si_{(1-x)}Ge_x$ and the strain state of the released $Si_{(1-x)}Ge_x$. For example, materials that can be grown over the $Si_{(1-x)}Ge_x$ include Ge, InGaP, or even a thin layer of Si.

Figure 6:
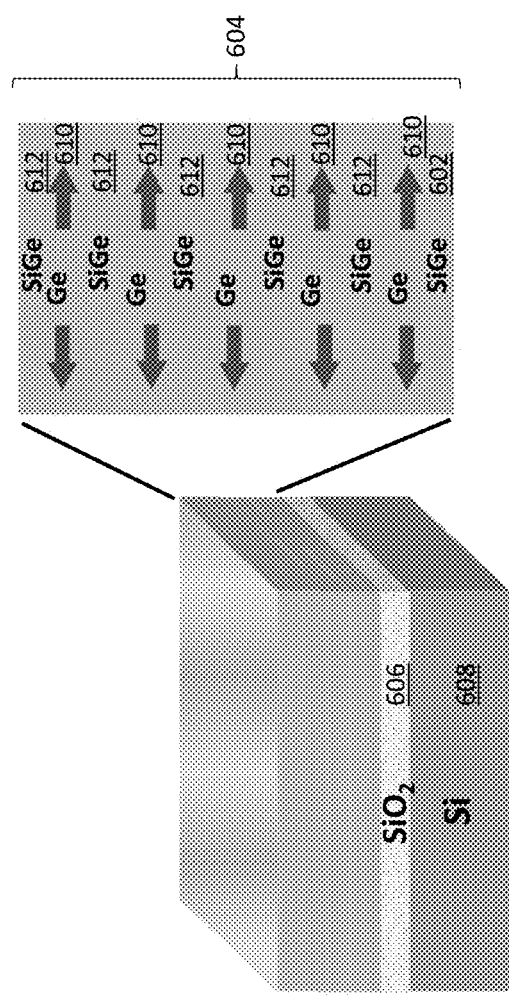
FIG. 6 is a schematic diagram of a SiGe/Ge quantum well structure for THz radiation grown on an elastically relaxed SiGe NM transferred to $SiO_2$. The arrows indicate that the Ge layers are under compression.

The high-quality, single-crystalline layers of silicon-germanium and the high-quality, single-crystalline layers of germanium can be incorporated in a variety of electronic devices, including optical and optoelectronic devices. The layers can be incorporated as strain-free layers, as elastic strain sharing sub-layers in a multilayered heterostructure, or as strained layers bonded to a host substrate. For example, the silicon-germanium and/or germanium layers can be incorporated into a quantum well structure for a terahertz radiation source or a terahertz radiation detector. One example of a quantum well structure is composed of alternating layers of $Si_{(1-x)}Ge_x$ and Ge that provide a series of Ge quantum well layers, each sandwiched between a pair of $Si_{(1-x)}Ge_x$ barriers. The schematic diagram in FIG. 6 shows a terahertz (THz) radiation source that includes such a quantum well structure. The radiation source can be formed by growing a single-crystalline layer of $Si_{(1-x)}Ge_x$ with the desired Ge content on a sacrificial growth substrate, as described herein, and releasing the layer as a $Si_{(1-x)}Ge_x$ film 602. Released film 602 can be transferred and bonded to a host substrate that includes a thin dielectric layer 606, such as $SiO_2$, on a base substrate 608, such as a silicon handle wafer. The bonding of $Si_{(1-x)}Ge_x$ film 602 to dielectric layer 606 can be carried out by subjecting the transferred film and the dielectric layer to a heat treatment at an elevated temperature—that is, a temperature above room temperature. For example, the bonding of $Si_{(1-x)}Ge_x$ film 602 to dielectric layer 606 can be carried out at temperatures of at least 500° C., including temperatures in the range from 500° C. to 1000° C. (Alternatively, in order to retain the strain in $Si_{(1-x)}Ge_x$ film 602, that film can be bonded to dielectric layer 606 before it is released from its sacrificial growth substrate.) A quantum well structure 604 composed of alternating layers of Ge 610 quantum wells and SiGe 612 barriers can then be grown epitaxially on $Si_{(1-x)}Ge_x$ film 602. In the embodiment shown in FIG. 6, $Si_{(1-x)}Ge_x$ film 602 and SiGe layers 612 are elastically relaxed and Ge layers 610 are grown with a compressive strain (as indicated by the arrows). (Alternatively, in order to provide a quantum well heterostructure in which the elastic strain is shared between the well layers and the barrier layers, the quantum well stack can be grown on $Si_{(1-x)}Ge_x$ film 602 before it is released from the sacrificial growth substrate.) The THz radiation source further includes a first electrode (not shown) in electrical communication with the upper surface of the quantum well structure and a second electrode (not shown) in electrical communication with the lower surface of the quantum well structure.

Other devices into which the high-quality, single-crystalline layers of silicon-germanium and the high-quality, single-crystalline layers of germanium can be incorporated include transistors, including field effect transistors and heterojunction bipolar transistors (HBT), complementary metal oxide semiconductor (CMOS) devices, quantum cascade lasers, tunable light emitters, infrared photodetectors, and other sensors.

Figure 7:
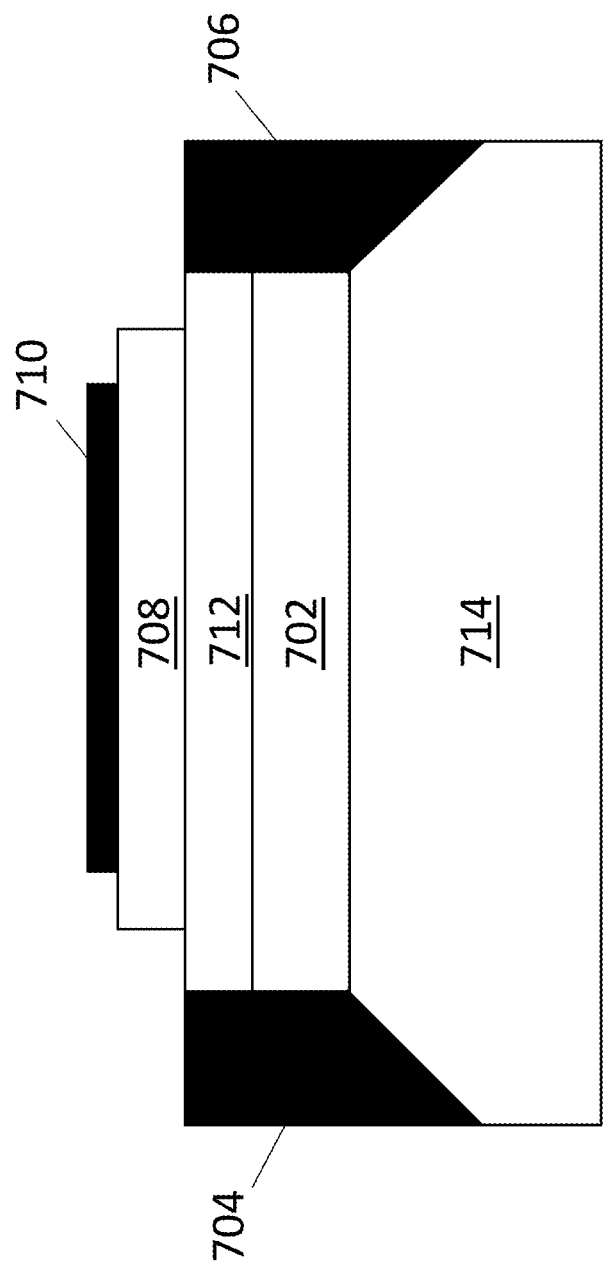
FIG. 7 is a schematic diagram of a MOSFET that includes a $Si_{(1-x)}Ge_x$ film as a channel layer.

A cross-sectional view of one embodiment of a metal oxide semiconductor field effect transistor (MOSFET) that includes a high-quality, single-crystalline $Si_{(1-x)}Ge_x$ film is shown in FIG. 7. In the MOSFET, the $Si_{(1-x)}Ge_x$ film 702, which provides the channel layer for the transistor, separates, and is in electrical communication with, a source electrode 704 and a drain electrode 706. A gate stack disposed over $Si_{(1-x)}Ge_x$ film 702 includes a gate oxide 708 and a gate electrode 710. A spacer layer 712, such as a Si layer, separates $Si_{(1-x)}Ge_x$ film 702 from gate oxide 708. $Si_{(1-x)}Ge_x$ film 702 is bonded to base substrate 714, which may be a Si handle wafer.

Figure 8:
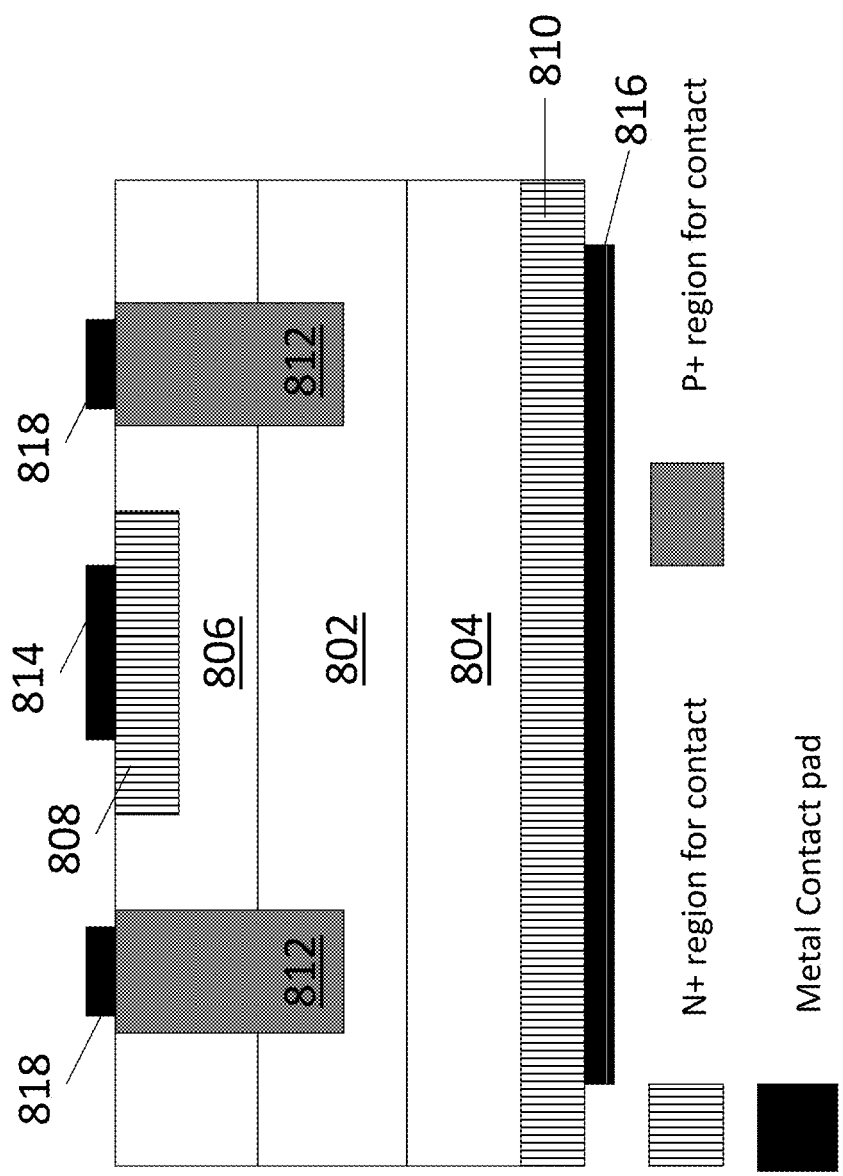
FIG. 8 is a schematic diagram of an HBT that includes a $Si_{(1-x)}Ge_x$ film as a base layer.

A cross-sectional view of one embodiment of an HBT that includes a high-quality, single-crystalline $Si_{(1-x)}Ge_x$ film is shown in FIG. 8. In the HBT, a P-type doped $Si_{(1-x)}Ge_x$ film 802, which provides the Base for the transistor, positioned between an N-type doped Emitter (e.g., n-Si) 804 and an N-type doped Collector (e.g., n-Si) 806 to form an N/P/N heterostructure. A heavily N-type doped region (e.g., n++Si) in Collector 806 provides a collector contact region 808 and a heavily N-type doped region (e.g., n++Si in Emitter 804 provides an emitter contact region 810. Heavily P-type doped regions (p++) extending into Base 802 provide base contact regions 812. Finally, metal contact pads 814, 816, and 818 in electrical communication with collector contact region 808, emitter contact region 810, and base emitter regions 812, provide collector contact, emitter contact, and base contacts, respectively.

Figure 9:
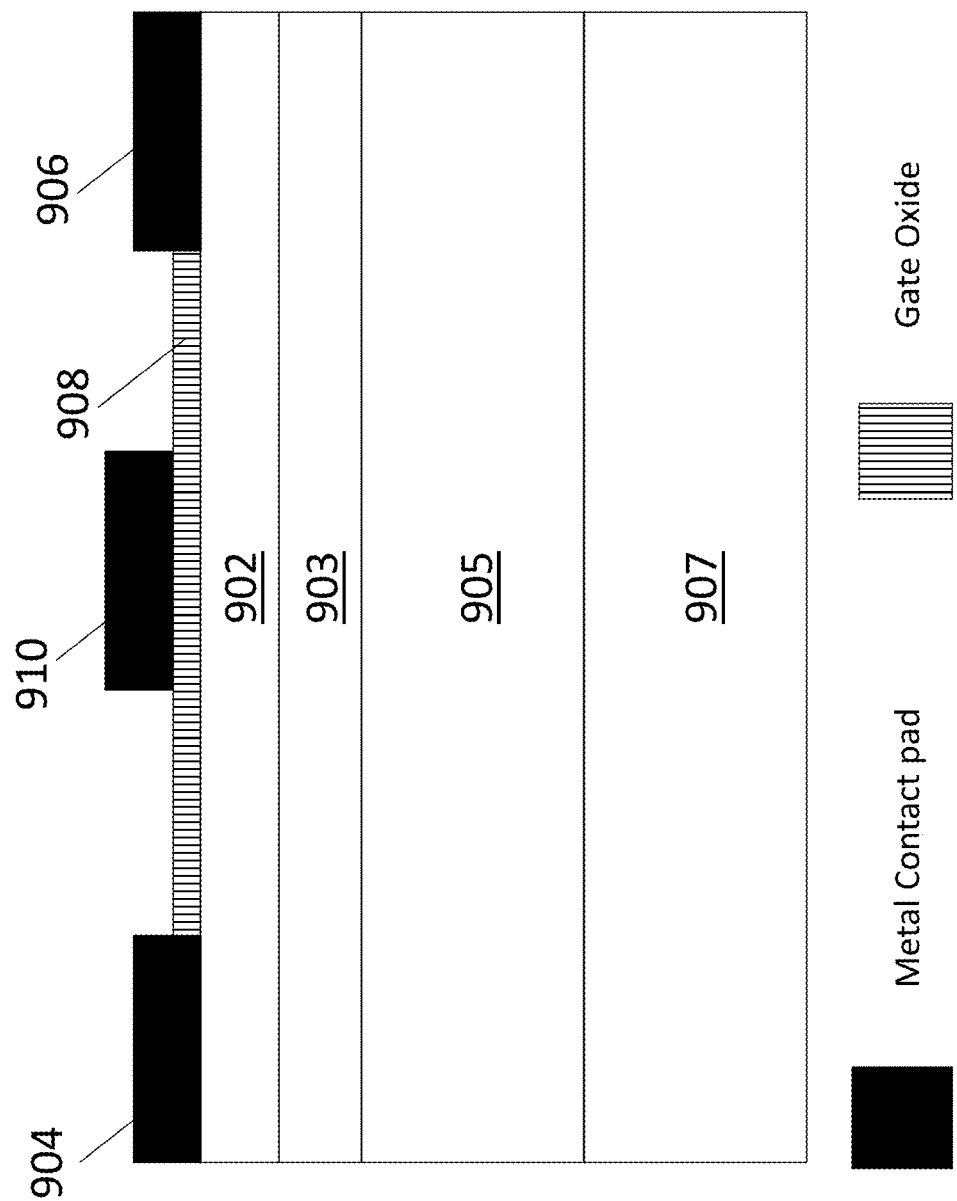
FIG. 9 is a schematic diagram of a MODFET that includes a $Si_{(1-x)}Ge_x$ film as a spacer layer.

A cross-sectional view of one embodiment of a modulation-doped field effect transistor (MODFET) that includes a high-quality, single-crystalline $Si_{(1-x)}Ge_x$ film is shown in FIG. 9. In the MODFET, a Ge film 903 provides the channel layer for the transistor. Ge film 903 overlies a SiGe buffer layer 905 on a Ge substrate 907. Ge film 903 is spaced apart from an overlying gate oxide 908 by a spacer layer of the $Si_{(1-x)}Ge_x$ 902. A source electrode 904 and a drain electrode 906 are in electrical communication through spacer layer 902 and a gate electrode 910 is disposed over gate oxide 908.

The transistors can be fabricated using the epitaxy and transfer printing methods described herein. As a result, the $Si_{(1-x)}Ge_x$ films in the transistors can be strained, unstrained, or in a strain sharing state with an adjacent layer and they can have an epitaxial or a non-epitaxial relationship with their adjacent layers.

Example

This example illustrates methods for growing high-quality, single-crystalline germanium on a sacrificial layer, followed by the release and transfer of that layer to a host substrate.

Ge/AlAs/GaAs Heterostructure Growth

The Ge/GaAs/AlAs heterostructures were grown in a low pressure (0.1 bar) metal-organic vapor phase epitaxy (MOVPE) system. Germane ($GeH_4$), arsine ($AsH_3$), triethyl gallium (TEGa) and trimethyl aluminum (TMAl) were employed as the Ge, As, Ga and Al precursors for the growth. Hydrogen was used as the carrier gas with a total flow rate of 0.31 mol/min. The growth temperatures for the AlAs layer and the Ge layer were 750° C. and 565° C., respectively. The thicknesses of the AlAs layer and the Ge layer were 200-1000 nm and 70-100 nm, respectively, as determined by Scanning Electron Microscopy (SEM). The dislocation defect density can be measured by the etch-pit method. The etch-pit method is used to determine the dislocation defect density when this density is in a relatively low range ($<1\times10^6$ cm$^{-2}$). (See, D. J. Stirland, 'The Relationship between Etch Pit Density and Dislocation Density for (001) GaAs', *Journal of Crystal Growth*, 7 (1986) 493-502.)

Etching

The sample was first cleaned by acetone and isopropyl alcohol (IPA), followed by a prebake at 100° C. for 60 seconds. A deionized-water (DI) cleaning was not performed, in order to retain the Ge oxide layer that was observed to help in the bond between the sample and photoresist layer.

The resist was then spun onto the sample, forming a smooth and flexible layer that could keep the nanomembrane (NM) in shape during etching. The compressive stress in the resist layer needed to be well controlled in order to curve the NM from the edge and open access for the etchant. Three resists were tried, including Shipley photoresist 1813, PMMA, and ZEP 520A. All three worked quite well for the process.

PR 1813 showed the best result for the selected sample and etchant. The recipe used for all resists included spin coating at 4000 rpm for 30 seconds followed by hard baking for 3 minutes at 100° C. (PR 1813) or 90 seconds at 180° C. (PMMA and ZEP).

Following the photoresist coating, the sample was transferred to a holder for immersion in the etchant solution. An angle of about 20° to the etchant was found to be ideal, with a range from 15-30 degrees yielding comparable results. The etchant used was diluted hydrochloric acid (1:8 37% (vol.) HCl:$H_2O$). Observations suggest that this allowed for a well-controlled etch, since the surface tension from the liquid was sufficient to float a large-area NM with the help of the resist layer. The etching started from the edge of the sample where the sacrificial layer was etched, and the released template layer was dragged up by the intact resist, floating on the etchant surface and therefore opening the gap between template layer and the substrate that facilitated the circulation of etchant as well as continuous etching. The immersion rate was controlled at around 0.8 mm/hour to provide enough time for the escape of produced gasses from the interface.

Once the etching was complete, the NM with intact resist floated freely on the surface of the etchant solution, and could be gently picked up by the desired substrate. A soft baking at 70° C. for 30 minutes was then performed in order to evaporate the excess water at the interface between the NM and substrate, so that the bond between the two layers would become relatively strong.

Suitable solvents, such as acetone and isopropyl alcohol, were subsequently used for photoresist removal. Finally, a hard bake at 100° C. for 60 minutes was done to strengthen the contact between the NM and the substrate.

AFM Characterization

Figures 5A, 5B:
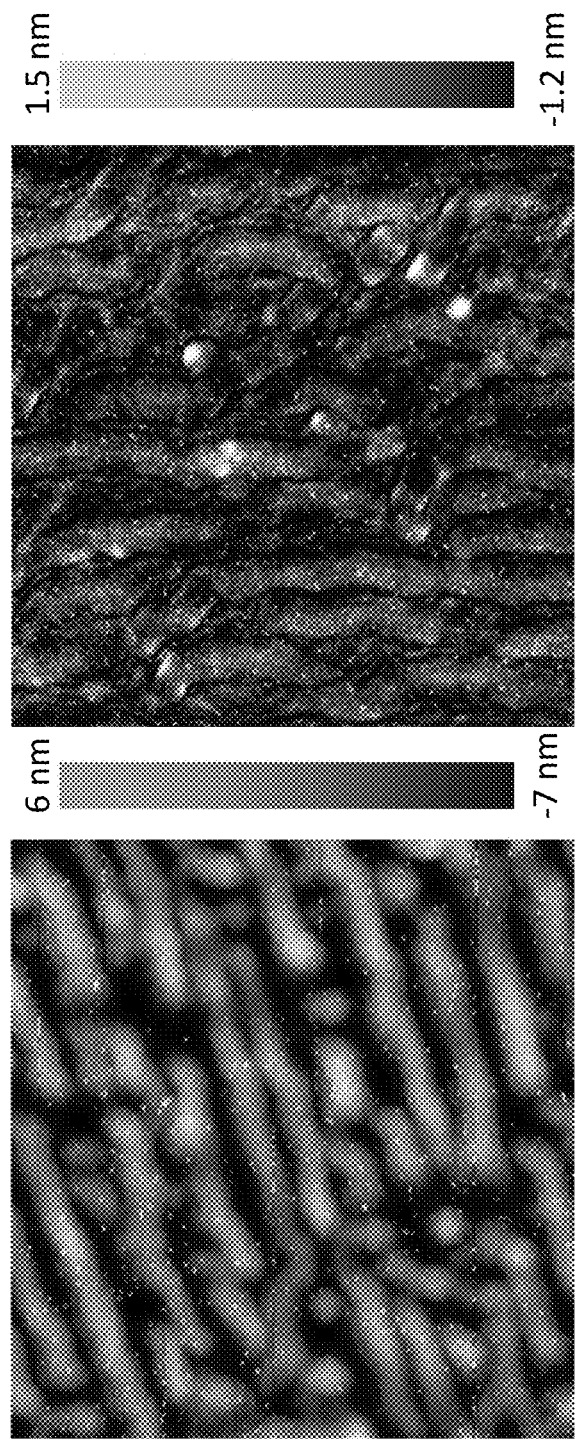
FIG. 5A is an atomic force microscope image of a layer of single-crystalline Ge as-grown on a GaAs base substrate with an AlAs sacrificial layer.
FIG. 5B is an atomic force microscope image of the Ge film after being released from the growth heterostructure and transferred to a host substrate of oxidized silicon.

The surface roughness of both the as-grown and transferred Ge NM was characterized separately by AFM. A Bruker Bioscope Catalyst AFM was operated under tapping mode for a 10 μm scan window with a lateral resolution of 20 nm. In the comparison experiment shown in FIGS. 5A and 5B, the grown Ge (FIG. 5A) was cleaned with acetone IPA and DI $H_2O$ prior to the taking of measurements. The Ge NM was transferred to a polished Si wafer (FIG. 5B) and cleaned with hydrofluoric acid (HF) and DI water immediately before the roughness characterization in order to minimize the influence of the germanium oxide.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. Single-crystalline silicon-germanium comprising a layer of single-crystalline $Si_{(1-x)}Ge_x$, where $0.4 \leq x < 1$, having a thickness of at least 40 nm, wherein the single-crystalline $Si_{(1-x)}Ge_x$ does not comprise a mosaic distribution of crystallographic orientations and the single-crystalline silicon-germanium is not bonded to a layer of silicon with which it forms an epitaxial interface.

2. The single-crystalline silicon-germanium of claim 1, wherein the layer of single-crystalline $Si_{(1-x)}Ge_x$ is unstrained.

3. Single-crystalline silicon-germanium comprising a layer of single-crystalline $Si_{(1-x)}Ge_x$, where $0.4 \leq x < 1$, having a thickness of at least 40 nm, wherein the single-crystalline $Si_{(1-x)}Ge_x$ does not comprise a mosaic distribution of crystallographic orientations and the layer of unstrained, single-crystalline $Si_{(1-x)}Ge_x$ is a free-standing layer.

4. The single-crystalline silicon-germanium of claim 2, wherein the unstrained layer of single-crystalline $Si_{(1-x)}Ge_x$ is bonded to a host substrate at a non-epitaxial interface.

5. The single-crystalline silicon-germanium of claim 1, wherein the layer of single-crystalline $Si_{(1-x)}Ge_x$ is strained.

6. The single-crystalline silicon-germanium of claim 5, wherein the strained layer of single-crystalline $Si_{(1-x)}Ge_x$ is bonded to a host substrate at a non-epitaxial interface that prevents the strain in the layer of single-crystalline $Si_{(1-x)}Ge_x$ from relaxing.

7. The single-crystalline silicon-germanium of claim 5, wherein the strained layer of single-crystalline $Si_{(1-x)}Ge_x$ is joined with a layer of a second semiconductor at an epitaxial interface, wherein elastic strain is shared between the layer of single-crystalline $Si_{(1-x)}Ge_x$ and the layer of the second semiconductor.

8. The single-crystalline silicon-germanium of claim 7, wherein the second semiconductor is a Group III-V semiconductor.

9. The single-crystalline silicon-germanium of claim 8, wherein the Group III-V semiconductor is GaAs.

10. The single-crystalline silicon-germanium of claim 8, wherein the Group III-V semiconductor is GaInP.

11. The single-crystalline silicon-germanium of claim 1, wherein the layer has a thickness of at least 50 nm.

12. The single-crystalline silicon-germanium of claim 1, wherein the layer has a thickness of at least 100 nm.

13. The single-crystalline silicon-germanium of claim 1, wherein the layer has a thickness of at least 500 nm.

14. The single-crystalline silicon-germanium of claim 1, wherein $x \geq 0.5$.

15. The single-crystalline silicon-germanium of claim 1, wherein $x \geq 0.8$.

16. The single-crystalline silicon-germanium of claim 1, wherein the layer of single-crystalline $Si_{(1-x)}Ge_x$ has an area of at least 1 $mm^2$.

17. The single-crystalline silicon-germanium of claim 1, wherein the layer of single-crystalline $Si_{(1-x)}Ge_x$ has an area of at least 10 $mm^2$.

18. The single-crystalline silicon-germanium of claim 1, wherein the layer of single-crystalline $Si_{(1-x)}Ge_x$ has a thickness in the range from 50 nm to 10 µm.

19. The single-crystalline silicon-germanium of claim 1, wherein the layer of single-crystalline $Si_{(1-x)}Ge_x$ has an rms surface roughness of no greater than 2 nm.

20. The single-crystalline silicon-germanium of claim 1, wherein the layer of single-crystalline $Si_{(1-x)}Ge_x$ has an rms surface roughness of no greater than 1 nm.

21. An electronic device comprising:
a first electrode;
a second electrode; and
a layer of single-crystalline $Si_{(1-x)}Ge_x$, where $0.4 \leq x < 1$, in electrical communication with the first electrode and the second electrode, the layer of single-crystalline $Si_{(1-x)}Ge_x$ having a thickness of at least 40 nm, wherein the single-crystalline $Si_{(1-x)}Ge_x$ does not comprise a mosaic distribution of crystallographic orientations and the single-crystalline silicon-germanium is not bonded to a layer of silicon with which it forms an epitaxial interface.

22. Single-crystalline silicon-germanium comprising a layer of single-crystalline $Si_{(1-x)}Ge_x$, where $0.4 \leq x < 1$, having a thickness of at least 40 nm, wherein the single-crystalline $Si_{(1-x)}Ge_x$ does not comprise a mosaic distribution of crystallographic orientations, and further wherein the layer of single-crystalline $Si_{(1-x)}Ge_x$ forms at least one epitaxial interface with another semiconductor and the concentration of lattice mismatch-induced misfit dislocations at the at least one epitaxial interface is no greater than $1 \times 10^5$ $cm^{-2}$.

23. The single-crystalline silicon-germanium of claim 22, wherein the concentration of lattice mismatch-induced misfit dislocations at the at least one epitaxial interface is no greater than $1 \times 10^3$ $cm^{-2}$.

24. The single-crystal silicon-germanium of claim 22, wherein the at least one epitaxial interface is free of lattice mismatch-induced misfit dislocations.

\* \* \* \* \*